United States Patent [19]

Streckenbach et al.

[11] 3,973,241
[45] Aug. 3, 1976

[54] INFORMATION TRANSMISSION SYSTEM

[75] Inventors: Wulf-Christian Streckenbach, Hemmingen; Kurt Knuth, Hannover, both of Germany

[73] Assignee: Licentia Patent-Verwaltungs-G.m.b.H, Frankfurt am Main, Germany

[22] Filed: June 18, 1975

[21] Appl. No.: 588,177

[30] Foreign Application Priority Data
June 18, 1974 Germany............................ 2429066
Nov. 16, 1974 Germany............................ 2454463

[52] U.S. Cl. ........................ 340/167 A; 340/167 R; 340/147 C; 340/171 A; 340/168 R
[51] Int. Cl.² ........................................... H04B 1/06
[58] Field of Search ........ 340/171 A, 147 R, 147 C, 340/147 PC, 167 R, 167 A, 168 R, 148; 178/DIG. 15; 343/225; 325/392

[56] References Cited
UNITED STATES PATENTS
3,892,920  7/1975  Kolm .............................. 340/148 X Primary Examiner—Harold I. Pitts
Attorney, Agent, or Firm—Spencer & Kaye

[57] ABSTRACT

A remote control system utilizing an alternating signal, in which the duration of the signal is measured with respect to a time frame composed of a succession of adjacent time groups each subdivided into a succession of adjacent time channels. A first item of information provided by the signal is obtained by observing the time group containing the end of the signal while a second item of information provided by the signal is obtained by observing the time channel within such group containing the end of signal.

25 Claims, 7 Drawing Figures

INFORMATION TRANSMISSION SYSTEM

BACKGROUND OF THE INVENTION

The present invention relates to a system for the transmission of information by means of a remote control signal composed of first and second signal components at different frequencies, in which the information is represented by the time duration of the first signal, particularly for ultrasonic remote controls in television receivers.

It is known to transmit information by coding a signal serving as a carrier in accordance with such information. The coding may be effected, for example, by controlling the length of each time period during which the signal is being transmitted in dependence on the information (pulse duration modulation). In order to recover this information, the receiver must be provided with a decoding circuit which permits evaluation of the time duration of the signal.

Such a circuit is disclosed in the periodical "Funkschau" 1973, Issue No. 18, pages 675–677, for an ultrasonic remote control system for television receivers. In this known system, the ultrasonic signal emitted by a transmitter is composed of two immediately succeeding components at different frequencies, the components being coded with respect to both their frequency and duration.

The frequency of the first ultrasonic signal here determines the type of information, i.e. whether a channel is being selected, for example (switching function), or an analog function is being performed in the television receiver, while the time duration of the first ultrasonic signal determines the channel number or the type and direction of the analog function, i.e. the value of the information of the type indicated by the frequency. The second immediately following ultrasonic signal effects performance of the previously recognized function.

The evaluation of the time duration of the first ultrasonic signal is effected in the known circuit in that during the presence of the ultrasonic signal a multivibrator is switched on to produce pulses each of a defined period duration. These pulses are counted by an electronic counter which sets its counting state in dependence on the time duration of the ultrasonic signal, which practically constitutes the decoded information.

SUMMARY OF THE INVENTION

It is an object of the present invention to simplify the known system for the transmission of information.

This and other objects are accomplished, in a system for transmitting information by means of a remote control signal including a first signal component and a second signal component at respectively different frequencies where an item of information is represented by the time duration of the first signal component, particularly for an ultrasonic remote control system for television receivers, in that while maintaining the frequency of the signal constant, another item of information is represented by the particular one of a succession of given time regions, or intervals, in which the end of the time period of the signal occurs.

The division into time regions, or intervals, used in the system of the present invention has the advantage that it is necessary only to evaluate the time duration of the transmitted signal.

Once a time region has been determined, the value of the information of the type belonging to this time region is determined within this region by evaluating the time duration of the transmitted signal. In contrast, in the known system it is additionally necessary to evaluate the frequency of the first signal and this is relatively complicated since it requires the provision of resonant circuits.

DESCRIPTION OF THE PREFERRED EMBODIMENTS

Figure 1:
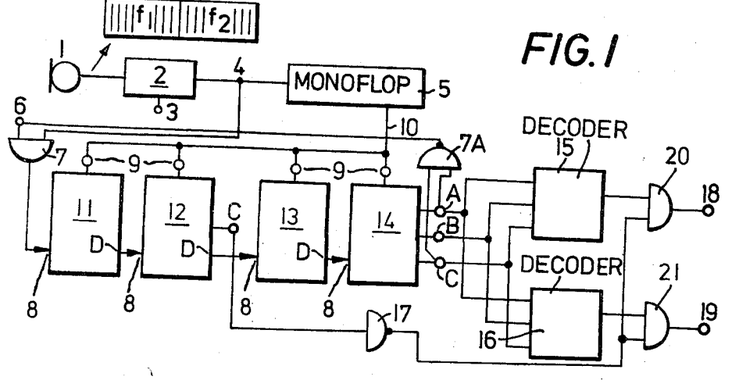
FIG. 1 is a block circuit diagram of a receiving circuit for a television receiver ultrasonic remote control system according to the invention.

FIG. 1 shows a receiver which includes a microphone 1 for receiving two immediately succeeding signal components at respective frequencies $f_1$ and $f_2$. In the following description, only the first signal at frequency $f_1$ will be considered in detail since it contains the information. The second component of the ultrasonic signal, at frequency $f_2$, effects, as in the known system, the execution of the function identified by the transmitted information.

Microphone 1 is connected in series with a receiver part 2 which includes, inter alia, one resonant circuit turned to frequency $f_1$ and one resonant circuit tuned to frequency $f_2$. It effects a separation of the components at the two frequencies $f_1$ and $f_2$. At the output 3 of receiver portion 2 there appear square wave oscillations at the frequency $f_2$ while at the output 4 there appear square wave oscillations at the frequency $f_1$. The circuit further includes a monostable multivibrator 5 connected to be triggered by the signal at output 4 so as to emit a pulse through a line 10 to the reset inputs 9 of counter stages 11, 12, 13 and 14. This pulse constitutes a reset pulse to set the counter stages 11, 12, 13 and 14 to the counting state "zero" at the beginning of the signal to enable them to count.

From output 4 the oscillations at frequency $f_1$ travel to an AND-gate 7. A circuit (not shown) applies a logic "1" at the input 6 of AND-gate 7 as long as frequency $f_2$ is not being received. Otherwise a logic "0" is present at input 6, i.e. AND gate 7 is blocked. This assures that with the beginning of the signal component at frequency $f_2$ no oscillations can pass through AND-gate 7 any longer so that possible reflections of the signal at frequency $f_1$ remain without influence.

The square wave oscillations at frequency $f_1$ pass through AND-gate 7 to the counting input 8 of counter stage 11 which forms a counter chain with counter stages 12, 13 and 14. Counter stage 11 is, for example, a known 4-bit binary counter which counts to 16 and transmits, when it reaches this counter state, a counting pulse, or transfer pulse, from its output D to the counting input 8 of the next counter stage 12. Thus, a counting pulse is applied to input 8 of stage 12 after every 16 pulses applied to input 8 of stage 11. Counter stage 12 counts to ten, as does the next counter stage 13, and after every ten counting pulses at their counting inputs 8 a counting pulse appears at the corresponding D outputs. The last counter stage 14 is, for example, a 3-bit binary counter with three outputs A, B, C. The logic states at these outputs A, B, C, indicate the respective time region.

When 1600 (16 × 10 × 10) periods of the received signal at frequency $f_1$ have been counted, the last counter stage 14 receives a counting pulse at its counting input 8 and assumes the logic "1" (one) counter state. At outputs A, B, C there appear signals corresponding to logic "1", "0", "0", respectively, which identify a time region I. Only after 1600 more periods, i.e. after a total of 3200 periods, will a further counting pulse reach counter stage 14. The logic states at outputs A, B, C will then be "0", "1", "0", respectively. They identify the now beginning time region II. In the illustrated circuit, a time region is thus defined by the time duration of 1600 oscillation periods. It can be seen that the respective counter state of counter stage 14 characterizes a time region. Time region I is recognized after 1600 oscillations and ends with the beginning of time region II at 3200 oscillations, etc.

Hereinafter the time regions will also be called groups since a time region is represented by a group, or number, of periods of the ultrasonic signal at frequency $f_1$.

Each group — i.e. each time region — has assigned to it a certain type of information. For example, group I indicates that an analog function (volume, brightness, etc.) is to be performed. Group II may relate to certain special functions (on, off, etc.), whereas further groups III and IV identify switching functions for the program selection.

It has already been mentioned that the outputs A, B, C of counter stage 14 determine the group identification. The outputs A, B, C are connected to a number of decoders corresponding to the number of groups, the drawing showing two decoders 15 and 16, for example.

Let it be assumed that decoder 15 is assigned to group I. That means that it responds after counting off 1600 periods, when the counter state of the last counter stage 14 reaches logic "1" and enables the series-connected AND gate 20, in that a logic "1" is applied to its upper input. If more than 3200 periods at frequency $f_1$ are received and counted, AND-gate 20 is blocked. Now decoder 16 assigned to group II responds and AND-gate 21 is enabled.

Once a group, and thus the type of transmitted information, has been determined, by the states of outputs A, B, C of counter stage 14, the time duration of the transmitted signal at frequency $f_1$ is determined, i.e. the particular value of the determined type of information. Among the number of periods representing a group, successive pluralities of periods are associated with successive channels and each channel corresponds to a particular quantity of information value. The channel corresponding to the particular information in a signal is determined by the location at which the time duration of the signal at frequency $f_1$ ends, i.e. after how many periods within a group. Channels I, II, III, ... n of a group are determined, for example, in that $1600 + n$ $160$ periods ($n = 1, 2, 3, \ldots 8$) are counted so that every 160 periods correspond to one channel.

Once a number of periods have been counted which identify the beginning of a group, a pulse representing the end of each successive channel is generated after every 160 periods. This is done by counter stage 12 which has its output C, representing the $2^2$ bit position value, connected with AND gates 20, 21 via an inverter 17.

Based on the code employed, a logic "1" is present at this output C if the counter state of counter stage 12 corresponds to a decimal value of four, five, six or seven, i.e. if the $2^2$ bit position value is unity, and a logic "0" is present at the other possible counter states so that output C will be switched to its logic "1" state once after every 160 periods and emits a pulse.

Within the first group, the first pulse appears at output C after 1664 ($1600 + 4 \times 16$) periods and ends after 1728 ($1600 + 8 \times 16$) periods. Only after 1824 ($1600 + 160 + 4 \times 16$) periods does a second pulse begin at output C.

Between the beginning of an emitted signal at frequency $f_1$ and the evaluated signal there thus exists a time delay. This has the advantage that otherwise the absence of a single ultrasonic oscillation could lead to faulty switching. If, for example, in FIG. 1, 1760 emitted ultrasonic oscillations are received, only one pulse is obtained from output C from within group I. The selected time delay takes into consideration that ultrasonic oscillations get lost on the transmission path or can be added by echoes and reflections.

If, for example, channel II of Group I is emitted by an ultrasonic transmitter, which is not shown in FIG. 1, 1920 ($1600 + 2 \times 160$) periods at frequency $f_1$ will reach counter chain 11, 12, 13, 14. After 1600 periods, decoder 15 enables AND gate 20. At this time, counter stages 11, 12 and 13 have the "0" counter stage. The remaining 320 periods are now counted in counter stages 11, 12, 13 and twice set output C of counter stage 12, in the logic "1" state, so that this output C thus emits two pulses. These pulses travel through inverter 17 and AND gate 20 to its output 18 which is connected with an evaluation circuit (not shown) for the information of group I.

The evaluation circuit recognizes the particular function value represented by two pulses, i.e. channel II, and the corresponding operation is initiated, or triggered, as mentioned above, by the subsequent signal portion at the other frequency $f_2$. In the described manner the particular channel is thus defined by the output at C of counter stage 12, which indicates the time duration from the beginning of the group until the end of the signal at frequency $f_1$ within the group.

Figure 2:
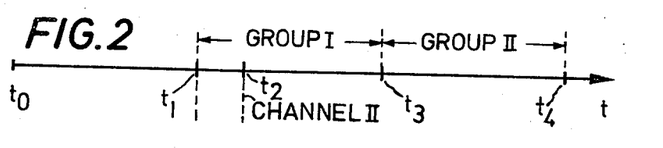
FIG. 2 is a time diagram showing division of a time period into certain time regions, used to explain the operation of the circuit of FIG. 1.

The above-described operation is illustrated in detail in FIG. 2. Groups I and II are shown with respect to time, each group covering an interval equal to 1600 periods of the ultrasonic signal at frequency $f_1$. The beginning of the transmitted ultrasonic signal occurs at $t_0$. Group I begins after 1600 periods, at time $t_1$, and ends after 1600 more periods, at time $t_3$, with the beginning of group II which ends at $t_4$.

The individual groups can also be separated from one another in time, i.e. be non-contiguous, which would constitute a variation from that shown in the drawing.

If channel II of group I is emitted, the first signal at frequency $f_1$ ends at time $t_2$ within group I. Channel II is defined by the time duration from the beginning $t_1$ of group I to time $t_2$.

The group or channel distribution may be selected as follows, for example:

Group I  1600 + n × 160 $f_1$ periods with n = 1, 2, . . . 8
Group II  3200 + n × 160 $f_1$ periods with n = 1, 2, . . . 8
Groups III and IV  4800 + m × 160 $f_1$ periods with m = 1, 2, . . . 16.

Whereas a greater interval, i.e. 2 pulses = 320 $f_1$ periods, exists between groups I and II or II and III, respectively, groups III and IV directly succeed one into the other so that the 8th channel of group III is followed by the first channel of group IV without any interval. The four mentioned groups have assigned to them four decoders and series-connected AND-gates. For the sake of clarity, only two decoders 15, 16 with AND-gates 20, 21 are shown in the drawing. One decoder and its AND-gate together practically form a gate circuit which assures that the pulses identifying the channel travel from output C of stage 12 to the associated evaluation circuit only after the counter state in counter stage 14 has reached the point which corresponds to the beginning of the group and until the end of the group.

If microphone 1 receives noise signals at frequency $f_1$, these initially enter the counter chain in the same manner as the useful signal and are counted. In order to avoid erroneous switching, AND-gate 7 is blocked if a "1" is present at output A, a "0" is present at B and a "1" is present at C of counter stage 14. Further noise signals can thus no longer reach stages 11, 12, 13, 14. Therefore a NAND-gate 7A is connected between the outputs A and C of the counter stage 14 and the AND-gate 7.

At the same time when counter stage 14 reaches the abovementioned state the information stored in decoders 15 and 16 during the passage of the individual groups is erased so that a noise signal of the other frequency $f_2$ will have no influence at this time.

The system according to the invention can be extended in a simple manner to more than four groups by connecting further decoders and associated AND gates to the outputs A, B, C of the last counter stage 14. The maximum number of decoders that can be connected to the last counter stage 14 corresponds to the maximum counter state of this counter stage.

FIGS. 3–7 illustrate one advantageous embodiment of a transmitter for the system of the invention. Corresponding parts bear the same reference numerals in FIGS. 3–7. The illustrated transmitter serves to emit remote control signals which are generated by a variable frequency oscillator 95. Furthermore, the transmitter is provided with key switches S1 - S32 which are associated with the desired remote control functions and which, when actuated, switch on the oscillator. The transmitter which will be described in detail below is distinguished in that key switches S1 - S32 are arranged, in the manner of columns and rows of a matrix 85, in groups and channels, the groups corresponding to the time regions.

Figure 3:
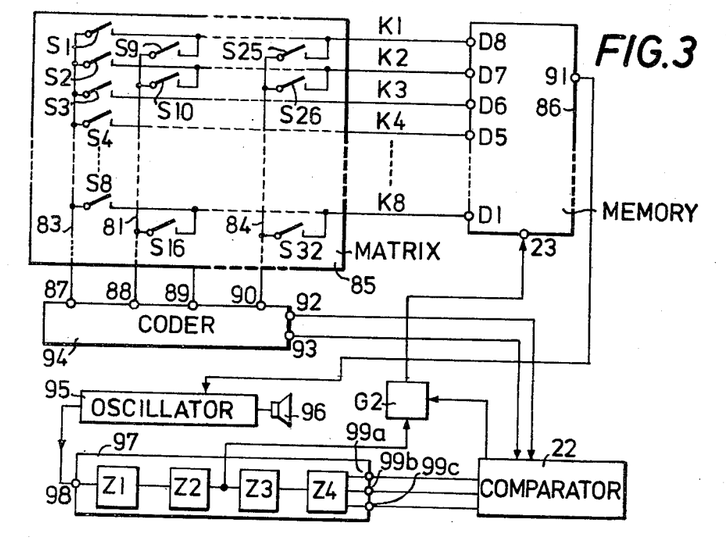
FIG. 3 is a block circuit diagram of a transmitter for a system according to the invention.

When a key S is actuated, a signal which identifies the associated group is fed to a comparator 22 and the associated channel is identified by the memory content of a memory 86. The group determines the time region and the channel determines the moment of the end of the time duration, in that the comparator 22 compares the output signals of a counter 97, which counts the oscillator oscillations, with the signal identifying the group and after reaching the counter state assigned to the group, the time duration of the remote control signal at the same frequency is terminated after a period which depends on the memory content of memory 86.

FIG. 3 is a basic circuit diagram of the transmitter. The key switches S1 to S32 are combined into a matrix 85, the eight key switches of each column being connected together by a respective one of four lines 81 to 84 (of which line 82 is not shown for reasons of clarity in FIG. 3). These lines effectively form the four columns of matrix 85. The rows of the matrix are formed by lines K1 to K8 each connected to four switches.

The vertical lines 81 to 84 are each associated with a respective one of four different time regions which again will hereinafter be called groups, while the horizontal lines K1 to K8 are each associated with a respective one of eight channels. Each key switch, i.e. each remote control instruction, is clearly defined in the matrix 85 configuration by an indication of the respective group and channel. For example, key switch S9 is identified with group I and channel K1.

Four lines 81 to 84, which identify the respective group, lead from matrix 85 to inputs 87, 88, 89 and 90, respectively, of a coder 94. Comparator 22 is connected with the two output terminals 92 and 93 of coder 94. Logic signals "1" or "0" appear at the outputs 92 and 93 of coder 94. Four combinations of the two logic signals "1" or "0" are possible and each such combination is assigned to one of the four groups. These combinations are generated by a coder 94 in dependence on which one of lines 81 to 84 is connected with the actuated key switch. If, for example, key switch S9 is actuated, information identifying the actuated key switch as belonging to group I is stored in comparator 22. Coder 94 can be of any suitable, well-known type.

The horizontal, or row, lines K1 to K8 of matrix 85, which represent the channels, are connected with the data inputs D1 to D8 of memory 86. The memory 86 stores the information identifying that one of channels K1 to K8 to which the respective actuated key switch belongs. The key switches S1, S9 and S25, for example, belong to channel K1. The numbers following the letter K of the reference numeral hereinafter indicate the number of the channel involved. Memories capable of performing this function are already well known in the art.

Each group, i.e. each time region, has associated with it a certain number of oscillations from oscillator 95. For example, group I begins after 1600 oscillations and ends after 2880 oscillations. Within this group, containing 1280 oscillations, there exist eight channels, each channel being identified by 160 oscillations (8 × 160 = 1280). If thus a key switch of group I and channel K1 (here key switch S9) is actuated, this means that 1600 + 160 = 1760 oscillator oscillations are to be emitted.

The complete group and channel distribution has already been discussed above.

Oscillator 95 serves to generate ultrasonic oscillations transmitted through a loudspeaker 96. The oscillations from oscillator 95 are also fed to the input 98 of a counter 97 which includes four counter stages Z1, Z2, Z3 and Z4. The four counter stages Z1 to Z4 are connected in series and form a counter chain in which the transfer, or shift, pulse from each counter stage is fed to the counting input of the next succeeding counter stage. The first counter stage Z1 counts to 16 in a binary code while the two counter stages Z2 and Z3 are decade counters counting in the BCD 8-4-2-1 code. Counter stage Z4 is a binary counter which can count to eight. The outputs 99a, 99b, 99c of the last counter stage Z4 are connected with comparator 22. In addition, a connecting line for the transfer pulse from counter stage Z2 leads from the counter output via a logic gate G2 to an input 23 of memory 86.

For the further explanation of the operation it is assumed that key switch S10 is actuated. Since this key switch belongs to group I, comparator 22 receives, via coder 94, information identifying group I and stores this information. At the same time memory 86 recognizes key switch S10 as belonging to channel K2 and stores this information via its data input D7. Key switch S10 indirectly also switches on oscilator 95, which emits oscillations that are transmitted by loudspeaker 96 and counted by counter 97.

After 1600 oscillations, i.e. with the beginning of group I, the counter state of the last counter stage Z4 is "one". Comparator 22, in which a signal identifying this group I had previously been stored, notes the beginning of group I and opens the previously blocked gate G2. The transfer pulses from counter stage Z2 now travel through this gate G2 to the memory 86. One such transfer pulse occurs after every 160 oscillator oscillations which correspond to a channel.

The channel K2 which corresponds to key S10 had previously been stored in memory 86 by a signal applied via line K2 and data input D7. Memory 86 then terminates the transmission of the remote control signal, the frequency of which had remained unchanged, after the input 23 of memory 86 has received a number of pulses which corresponds to the number of stored channels, i.e. two pulses in this case. These two pulses, however, correspond to 320 oscillator oscillations, i.e. two channels. The time duration of the transmitted remote control signal thus ends in the desired manner after 1600 + 320 = 1920 oscillations (corresponding to group I and channel K2).

FIGS. 4 to 7 show a more detailed circuit diagram of a transmitter for ultrasonic remote control. Terminals which bear the same reference numeral in the different figures are connected directly together in the circuit. In addition to the previously considered frequency $f_1$, which remains unchanged until the end of the selected time duration, the frequency $f_2$, which is generated following the above-mentioned time duration, is additionally required in the ultrasonic remote control system. Thus two ultrasonic signals at different frequencies $f_1$ and $f_2$ are emitted in succession. The two items of information defined by the first ultrasonic signal at frequency $f_1$ in the manner described above determine whether a switching function (selection of a station received by the television set) or an analog function (e.g. volume control) is to be effected or of which type and direction the analog function is to be. The second ultrasonic signal at frequency $f_2$ then effects execution of the instruction recognized from the two items of information. At the end of the time duration of the remote control signal at frequency $f_1$, oscillator 95 is switched to produce oscillations at frequency $f_2$ to execute the transmitted instruction.

Figure 4:
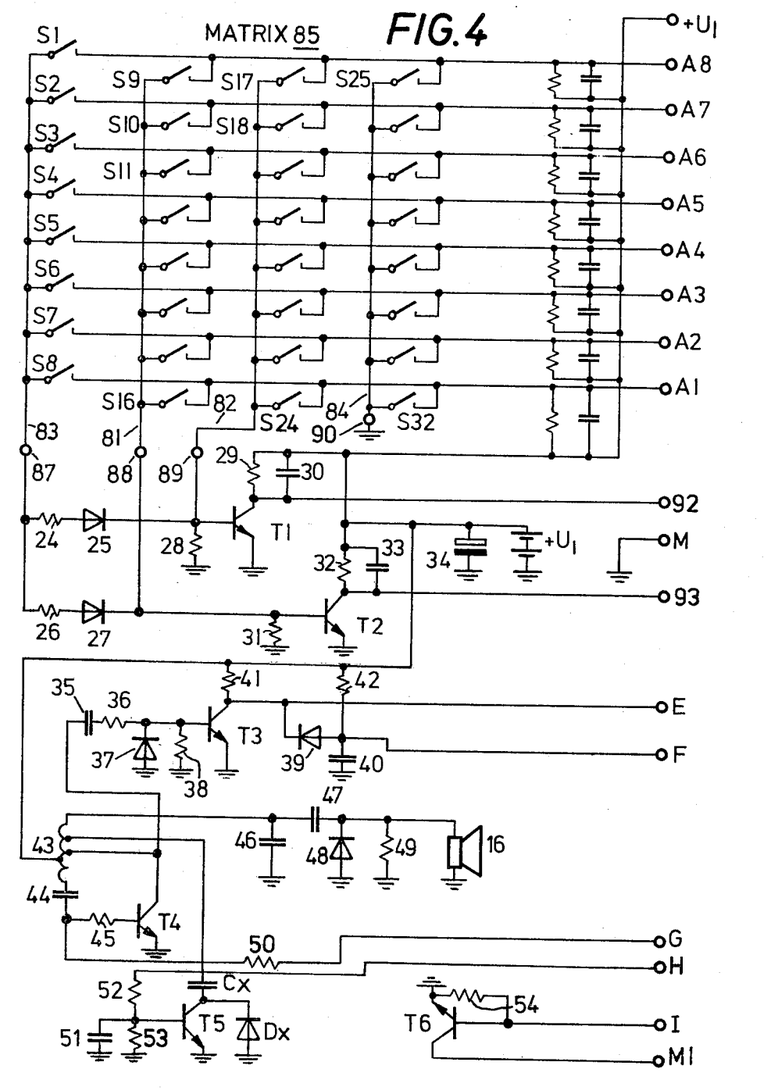
FIG. 4 shows a specific embodiment of a portion of the circuitry of an embodiment of a transmitter as shown in FIG. 3, in which the matrix and the oscillator are shown, the illustrated circuit portion constituting the peripheral circuit for an integrated circuit (IC) including the actual transmitter.
Figure 5:
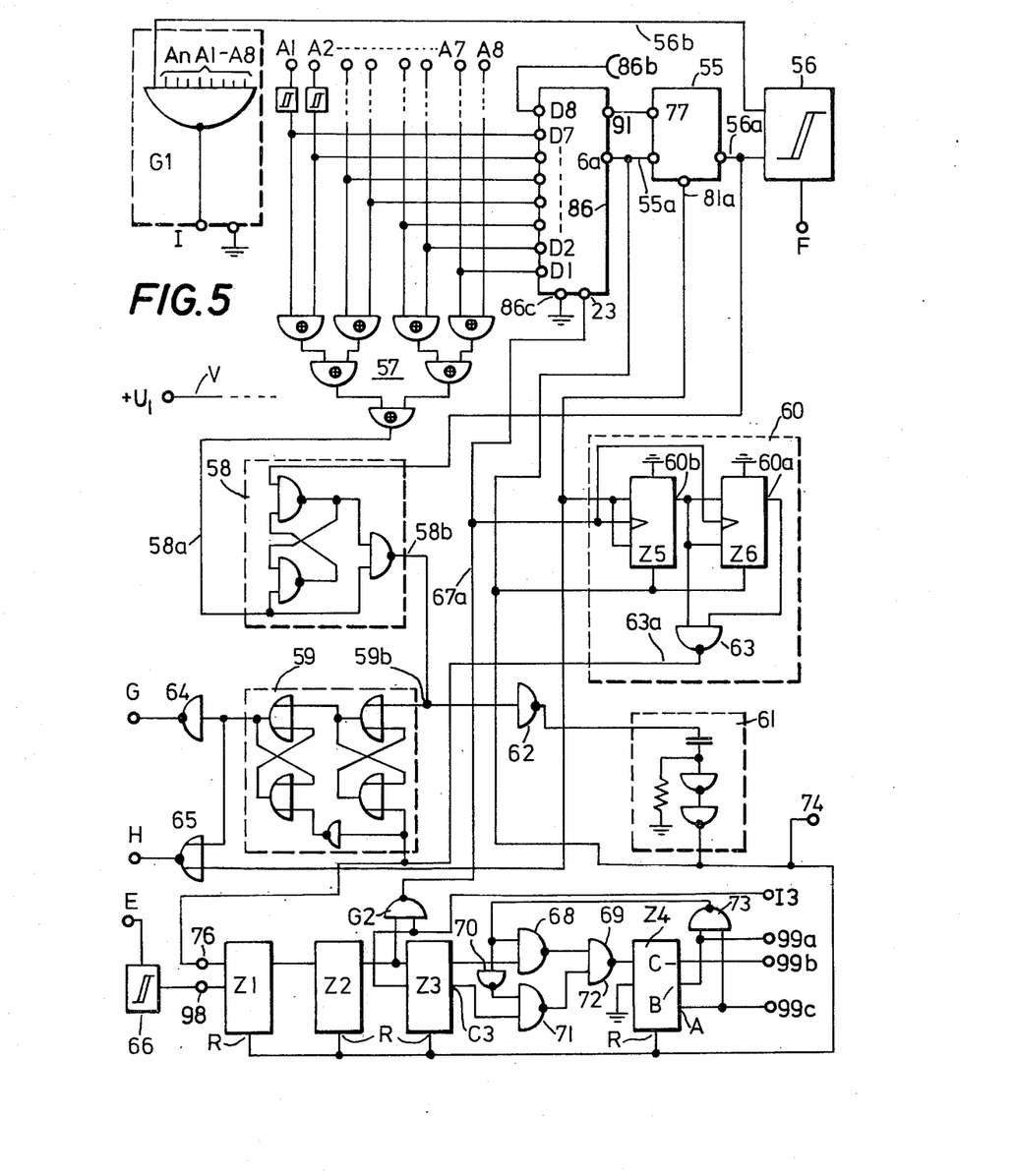
FIGS. 5, 6 and 7 together are a circuit diagram of a preferred embodiment of a transmitter in the form of an integrated structure.
Figures 6, 7:
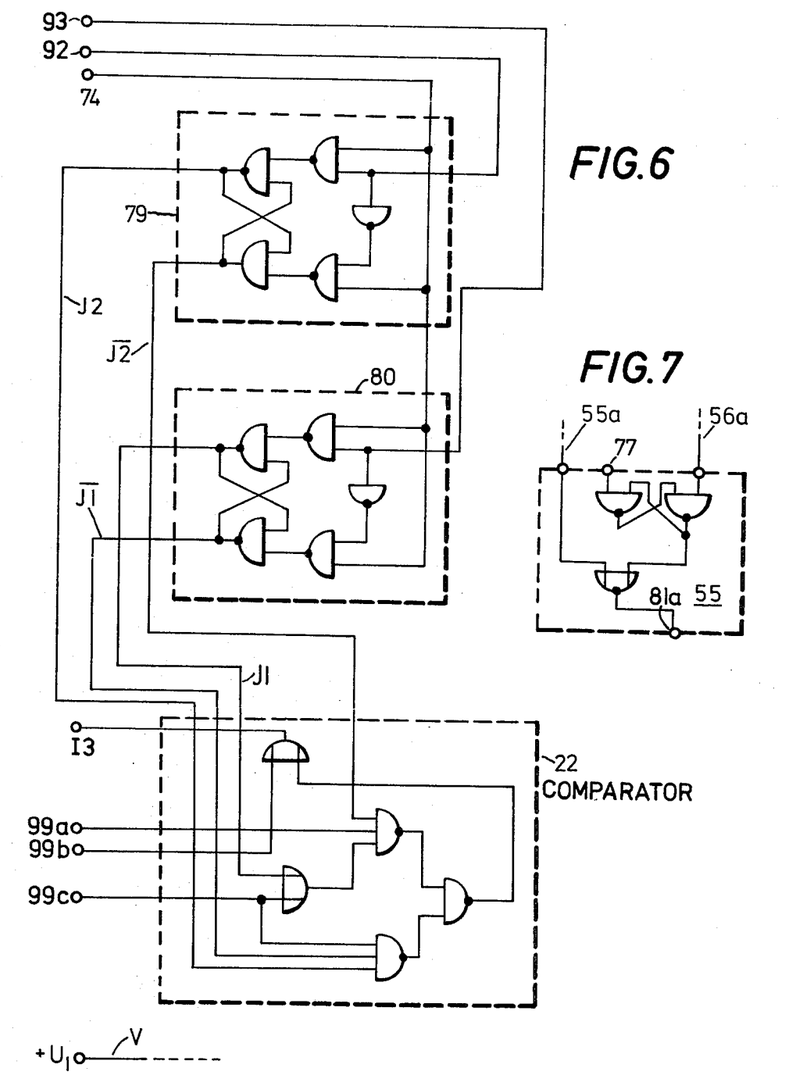

FIG. 4 shows the peripheral circuit for an IC (integrated circuit) whose inner connections are shown in FIGS. 5 to 7. The vertical lines 81 and 82 of matrix 85, which have already been mentioned in connection with FIG. 3, lead to the base terminals of transistors T1 and T2, respectively, which are part of the coder 94 also mentioned in connection with FIG. 3. Line 83 is connected via a resistor 24 and a diode 25 with the base of transistor T1 and via resistor 26 and a diode 27 with the base of transistor T2. The emitters of the two transistors T1 and T2 are connected directly to reference, or ground, potential, while their base terminals are connected with the reference potential via resistors 28 and 31. The base of transistor T1 is also connected with line 82 and the base of transistor T2 is connected with line 81. The line 84 which is associated with group IV is connected to reference potential.

The collectors of transistors T1 and T2 are connected via resistors 29 and 32, respectively, with parallel connected capacitors 30 and 33, respectively, to a source of positive voltage $+U_1$. The collectors of transistors T1 and T2 also lead to terminals 92 and 93, respectively, at which logic signals "0" and "1" appear. According to the selected convention, a logic "1" is present at a terminal when a positive voltage of approximately the value $+U_1$ appears thereat while a logic "0" appears if the voltage is very low or no voltage is present at all. The collector of transistor T2 is also connected via resistor 32, with a battery of the voltage $+U_1$, across which a capacitor 34 is connected in parallel and which serves as the voltage supply.

Transistors T1 and T2 may each take on a conductive or blocking state. When a transistor is blocking, a logic "1" will appear at the terminal connected with its collector, while a logic "0" will be present when the transistor is conductive.

When all key switches S1 to S24 of groups I, II and III of matrix 85 are open, both transistors T1 and T2 are blocking. This condition exists if all switches S25 to S32 of group IV are open or if one of those switches is closed. If, on the other hand, a key switch S1 to S8 of group III is closed, a positive voltage will be applied to the base terminals of transistors T1 and T2 so that the transistors are made conductive. The logic signals "0" then appear at terminals 92 and 93. If a key switch S9 to S16 of group I is actuated, only transistor T2 becomes conductive. The signals at terminals 92 and 93 are then: terminal 92 = "1", terminal 93 = "0". The signals at terminals 92 and 93 which are connected with comparator 22 (see FIG. 3) thus identify the group associated to the actuated key switch. The identification of the four groups by the logic signals at terminals 92 and 93 is as follows:

Group I : terminal 92 = "1"; terminal 93 = "0"
Group II : terminal 92 = "0"; terminal 93 = "1"
Group III : terminal 92 = "0"; terminal 93 = "0"
Group IV : terminal 92 = "1"; terminal 93 = "1"

The oscillator to produce the ultrasonic oscillations is formed by a transistor T4, an inductance 43, a capacitor 44 and a resistor 45. The upper end of inductance 43 is connected, via a capacitor 46, with reference potential and via a capacitor 47 with loudspeaker 96. Loudspeaker 96 is connected in parallel with a diode 48 and a resistor 49. The collector of transistor T4 is connected, via a capacitor 35 and a resistor 36, with the base of a transistor T3, the collector of which leads to a terminal E via which the oscillator oscillations reach the counter. The collector of transistor T3 is also connected, via a resistor 41, with a tap of inductance 43 and with the battery supplying voltage $+U_1$. From the collector of transistor T3 a didode 39 leads to a terminal F which is supplied, via capacitor 40, with reference potential, and via a resistor 42 with the voltage $+U_1$ from the battery. A resistor 38 and a diode 37 lead from the base of transistor T3 to reference potential. The didode 37 serves to rapidly reverse the polarity of the charge on capacitor 35 when a negative voltage is present at the collector of transistor T4.

The supply voltage for the peripheral circuit and the IC are provided by the battery shown in FIG. 4 and providing a voltage $+U_1$. In FIGS. 5 and 6 the lines V which lead from the terminals for $+U_1$ indicate that all logic circuits of the IC with their internal connections shown in FIGS. 5 to 7 are connected to the positive pole of the battery. The return path from these circuits to the reference potential is through transistor T6 shown in FIG. 4. Only gate G1 of FIG. 5 is directly connected to reference potential so that in the rest state only this gate G1 is initially provided with voltage.

If one of the key switches S1 to S32 is actuated, one, or both or none of the terminals 92, 93 is set to "0" potential — depending on the group with which that switch is associated. A "0" potential then appears at that one of the inputs A1 to A8 (FIG. 5) to which that switch is connected, switching the output I of NAND gate G1 to "1" potential so that transistor T6 shown in FIG. 4 is switched on by the voltage applied to its base via terminal I. The collector of transistor T6 is connected, via a terminal M1, with all the logic circuits of the IC, except for NAND-gate G1 to which the positive pole of battery $+U_1$ had previously been connected. By switching on transistor T6, whose emitter is at reference potential and is connected with its base via resistor 54, the entire IC is supplied with operating voltage $+U_1$.

The inputs A1 to A8 are connected in pairs with exclusive-OR gates 57, each via a respective Schmitt trigger as shown for inputs A1 and A2. The exclusive OR gates 57 are provided to prevent a wrong instruction from being generated when two key switches associated with two different channels are depressed simultaneously.

Upon correct actuation of one of the key switches S1 — S32 to provide the entire IC with voltage, a logic "1" is supplied to the connecting line 58a leading to one input of flip-flop 58. As long as the oscillator has not started to oscillate, "1" potential is present at the blocking input F of Schmitt trigger 56 so that the signal in line 56a is "0" and the output 58b of the flip-flop is "0". The signal on line 58b is applied to an inverter 62 whose output is connected to a starting pulse generator 61 which generates a short pulse with the potential "1" and whose output then drops back to "0" potential. This starting pulse resets counter stages Z1, Z2, Z3 and Z4 via their reset inputs R.

Counters Z1 and Z4 may each be a type TL 14520, Dual Binary Up Counter, and counters Z2 and Z3 may each be a type TL 14518, Dual BCD Up Counter. This starting pulse also sets counter stages Z5 and Z6 of a delaying circuit into the zero position. Each of stages Z5 and Z6 can be constituted, for example, by a type TL 14027 Dual JK flip-flop. The manufacturer of the named counters and flip-flops is AEG-Telefunken, Germany.

The starting pulse from generator 61 is also applied via a terminal 74 to the flip-flops 79 and 80 shown in FIG. 6 and to a conntrol input 6a of the memory 86 which is constituted by an 8-bit shift register. The shift register 86 is loaded in parallel by this pulse so that a "0" signal is stored, via one of the data inputs D1 to D8, in the shift register stage which corresponds to the depressed key switch and a "1" signal is stored in the other stages.

At the same time, the information present at terminals 92 and 93, identifying the selected group, is transmitted to the flip-flops 79, 80, under control of the starting pulse, and is held there. Since the counter stages Z5 and Z6 of the above-mentioned delaying circuit 60 have been reset, the potential "1" is present at output 63a of NAND gate 63 so that flip-flop 59 is set to have a "1" appear at terminal G of inverter 64. This supplies current to the base of transistor T4 of the oscillator of FIG. 4 so that the oscillator begins to oscillate.

Output 81a of flip-flop 55, shown in detail in FIG. 7, is at "0" potential since the output 91 of the shift register 86 is at "1" and the line 56a is at "0". Thus "1" potential is present at terminal H of NOR gate 65 and this causes the oscillator to begin to oscillate at frequency $f_1$. The potential at terminal F goes from "1" to "0" when the oscillator begins to oscillate. Thus the potential in line 56a changes from "0" to "1". Flip-flop 55 initially maintains its pre-existing state so that a "0" remains at its output 81a and a "1" at terminal H.

Gate G1 is connected with Schmitt trigger 56 via line 56b. Shortly after the oscillator begins to oscillate, for example, after about 0.5 ms, a logic "0" will arrive at gate G1 via this line 56b, so that the voltage supply for the IC remains effective via the conductive transistor T6, even after the actuated key switch has been released.

The oscillations generated by the oscillator are fed to the input 98 of the counter, composed of counter stages Z1, Z2, Z3 and Z4, via a Schmitt trigger 66 and are counted by the counter. The counter state of counter stage Z4 is compared with the output states of flip-flops 79 and 80, shown in FIG. 6, which have stored the information associated with the selected group and which are connected with comparator 22 via lines J1, $\overline{J1}$, J2 and $\overline{J2}$.

The output I3 of comparator 22 is initially at "0" potential. The logic signal at output I3 of comparator 22 then becomes "1" once the counter stage Z4 has reached a counter state at which the following logic condition has been met:

$I3 = C + (J1 + A) \cdot B \cdot \overline{J2} + \overline{J1} \cdot J2 \cdot A$, where A, B and C are the logic values at the corresponding outputs of counter stage Z4.

This results in the above-mentioned association between the logic states at terminals 92 and 93 and the number of oscillations produced until the "1" potential appears at the output I3 of comparator 22. If a key switch of group I is actuated, a "1" signal appears at output I3 after 1600 oscillations, for group II after 3200 oscillations, for group III after 4800 oscillations and for group IV after 6080 oscillations. The individual groups differ by 1600 oscillations — except for groups III/IV.

The transfer from counter stage Z3 to counter stage Z4 is effected during the counting process as long as the counter stage Z4 has not as yet reached state A = "1", B = "1". When this state A = B = "1" has been reached, the next transfer takes place from the other output C3 of counter stage Z3. This effect is produced by logic gates 68, 69, 70, 71 and 73. The difference between groups III and IV is thus only 1080 oscillations (8 × 160) while for the other groups the difference is 1600 oscillations (10 × 160).

If oscillator 95 has produced the number of oscillations for which the output I3 of comparator 22 will take on the "1" potential, counter stage Z3 is blocked with respect to further shift pulses from counter stage Z2 by the logic "1" at terminal I3. The output pulses from counter stage Z2 now produce pulse at the output of a NAND gate G2, which output is connected to the shift input 23 of shift register 86 so that after every 160 oscillations a shift instruction is generated.

Shift register 86 contains eight cells, or stages, output 91 being the output of the eighth stage. A logic "0" written in through one of the inputs D1 to D7 appears at output 91 after between seven and one shift instructions, since a "0" which has been fed in is shifted on by one step, or stage cell, in the direction toward the eighth stage with every shift instruction at input 23. The data input D8 must thus always be initially placed at logic "1" by a signal applied via terminal 86b. If a key switch which is connected with terminal A8 is depressed, a "0" must appear at output 91 after eight shift instructions. This is accomplished in that a "0" is written in via the ground-connected series input 86c of shift register 86 which then appears at output 91 after eight shift instructions.

After occurrence of the number of shift pulses determined by the particular key switch that has been depressed, "0" potential appears at the output 91 of shift register 86. If, for example, a key switch associated to channel K2 has been depressed, the logic "0 appears at output 91 after two shift pulses, i.e. after $2 \times 160 = 320$ oscillations. The logic "0" reaches input 77 of flip-flop 55 so that the latter flips over and a "1" appears at its output 81a and thus a "0 appears at terminal H. This blocks transistor T5 which operates as a frequency keying stage. At this time, the desired time duration of the transmitted signal at frequency $f_1$ is completed. The oscillator now oscillates at frequency $f_2$.

When transistor T5 is conductive it places capacitor Cx in parallel with part of the oscillating circuit inductance 43. The capacitance is transformed and acts as a capacitance in parallel with capacitance 46 which together with the oscillating circuit inductance 43 determines the oscillator oscillation frequency. In order to prevent transistor T5 from receiving a negative collector voltage, a diode Dx is connected between ground and its collector. The operating point of transistor T5 is influenced by capacitor 51 and resistors 52 and 53.

The signal "1" at the output 81a of flip-flop 55 enables the counting stage Z5 of the delaying circuit 60 so that subsequent pulses an line 67a are counted. When counter stages Z5 and Z6 have reached such a state that a "1" appears at each of their outputs 60a and 60b, output 63a of NAND gate 63 switches from "1" to "0". If at this time the initially actuated key switch is no longer being actuated, a "0" potential will be present at the setting input 59b of flip-flop 59 and flip-flop 59 is reset upon the appearance of the "0" potential on line 63a. This switches off the oscillator. If the key switch remains depressed for a longer period of time, maintaining a "1" at input 59b, flip-flop 59 will be reset only when the key switch is released. The delaying circuit 60 thus serves merely the purpose of assuring, when a key switch has been briefly depressed, that after generation of a certain number of oscillations at frequency $f_1$ the second frequency $f_2$ is emitted for a minimum period of time, for example 480 oscillations.

Flip-flop 58 can be set by a "1" signal on its input line 58a only when a "1" is present at input F of Schmitt trigger 56 so that the potential on line 56b of Schmitt trigger 56 is "0". This assures that a minimum interval exists between two remote control instructions during which the oscillator does not oscillate. This interval is necessary to prevent the echoes or the reverberation of a first remote control instruction from falsifying the immediately succeeding remote control instruction. Counter stage Z1 can be blocked by a signal applied via an input terminal 76 of that stage once 480 oscillations have been generated after switching to frequency $f_2$.

If two key switches are depressed very rapidly in succession, the first instruction will first be performed — as described above. Upon release of the key switch, flip-flop 58 flips so that a "1" appears at the input 59b of flip-flop 59 since the potential on line 58a goes to "0". If now another key switch is depressed immediately thereafter, line 58a again has "1" potential. However, flip-flop 58 remains in the flipped-back position as long as the potential in line 56a of Schmitt trigger 56 is "1", i.e. until the first instruction has been completed and a certain time has passed from the time when the oscillator ceased oscillating. Then the potential on line 56a will go to "0" and flip-flop 58 can flip so that a "0" appears in line 58b. This generates a new starting pulse and the second instruction can be performed.

The present invention is not limited to the above-described embodiment for ultrasonic remote control in a television receiver. Other possible applications are likewise conceivable as, for example, for the remote control of a radio receiver.

At outputs 18 and 19 in FIG. 1 can be connected shift-registers (not shown) which transform a series-information at its input into a parallel-information at its outpouts. From this shift-registers the control elements of the desired functions can be controlled.

It will be understood that the above description of the present invention is susceptible to various modifications, changes and adaptations, and the same are intended to be comprehended within the meaning and range of equivalents of the appended claims.

What is claimed is:

1. In an ultrasonic system for conveying information by means of a first ultrasonic signal having a first frequency and a second ultrasonic signal following the first signal in time and having a second frequency different from the first frequency, the system including a transmitter and a receiver for the ultrasonic signals and being arranged to cause the moment of termination of the first signal to occur in a selected one of a succession of time regions each occupying a defined time interval from the start of the first signal, the time region in which the first signal terminates representing the value of a first item of information, the improvement comprising means connected in said system to cause each such time region to be constituted by a succession of time channels each representing a respective value of a second item of information and to cause the moment of termination of the first signal to occur within that time channel representing the selected value of such second item of information, whereby the duration of the first signal completely identifies the respective values of two different items of information.

2. System as defined in claim 1 wherein at least one time region identifies a particular analog function and at least one further time region identifies a particular switching function.

3. System as defined in claim 1 wherein the end of one time region immediately precedes the beginning of the next succeeding time region.

4. System as defined in claim 1 wherein the end of one time region is separated in time from the beginning of the next succeeding time region.

5. System as defined in claim 1 wherein said means are arranged to begin the determination of the time duration of the first signal always at the beginning of a time region.

6. A system as defined in claim 1 wherein each time region is equal in duration to a predetermined number of periods of the first frequency, and said receiver comprises a counter connected to count the number of periods of a received first signal and to produce an output identifying each time region occupied by the first signal, at the beginning of each such region; and a plurality of gate circuits each associated with a respective time region and each connected to be enabled in response to the appearance of that counter output identifying the beginning of its associated time region.

7. A system as defined in claim 6 wherein each said gate circuit includes a conjunctive gate connected to said counter to transmit to an evaluation circuit pulses derived in said counter from the receipt of periods of the first signal after the beginning of the time region with which its respective gate circuit is associated for determination of whether the information contained in the first signal relates to that time region.

8. A system as defined in claim 7 wherein said counter comprises a plurality of counter stages connected together in series, with the last stage in the series having a plurality of output terminals presenting counting state signals constituting the output identifying each time region; and each said gate circuit comprises a decoder connected to selected output terminals of the last stage for enabling the associated conjunctive gate when the output from said counter identifies the time region with which that gate circuit is associated.

9. A system as defined in claim 8 further comprising an inverter connected between each said conjunctive gate and a selected output terminal of one of said counter stage connected ahead of said last counter for supplying a channel-identifying pulse to each said conjunctive gate after occurrence of a selected number of signal periods in each time region, whereby the channel-identifying pulses occurring during a particular time region will be passed by the conjunctive gate associated with that region to the evaluation circuit.

10. A system as defined in claim 8 further comprising an AND gate connected in series with the signal input to said counter and arranged to be blocked when said counter produces a selected output for preventing adverse influences due to noise signals, and said decoders are arranged to have the information therein erased when such selected output is reached.

11. A system as defined in claim 1 for controlling a plurality of remote control functions, wherein said means are associated with said transmitter and comprise an externally controllable oscillator having input means for receiving signals for starting and ending a train of oscillations at the first frequency and representing the first signal;

a plurality of key switches connected to control the starting and stopping of said oscillator, said switches being connected to constitute intersection points of the rows and columns of a matrix each column of which corresponds to a respective time region and each row of which corresponds to a respective time channel in each said time region, actuation of any one of said switches providing an indication of the particular time region and time channel with which that switch is associated in the matrix;

a comparator connected to receive a signal identifying the time region with which an actuated switch is associated;

a memory connected to receive and store a signal identifying the time channel with which such actuated switch is associated, and connected to the input means of said oscillator to provide an output signal for terminating the train of oscillations being produced by said oscillator;

means connected to cause said oscillator to start producing oscillations in response to actuation of a key switch;

a counter connected to count the oscillations duced by said oscillator and producing a counting state output identifying the start of each successive time region of the first signal being produced by said oscillator, said counter being connected to supply its counting state output to said comparator to cause said comparator to produce an output signal when the counting state output from said counter identifies the start of that time region with which the actuated switch is associated;

means connected between said comparator and said memory for causing said memory to produce its said oscillation-terminating signal at a time which follows production of the output signal from said comparator by a duration which corresponds to the time channel identified by the signal stored in said memory.

12. A system as defined in claim 11 wherein there are four of said time regions and the signal supplied to said comparator is constituted by two binary signals which have four possible combinations of values, with each such combination identifying a respective time region.

13. A system as defined in claim 12 comprising a coding circuit connected between said plurality of key switches and said comparator for producing said two binary signals, said coding circuit comprising two transistors connected to provide the binary signals at their respective collectors, with the signal at each collector representing a binary "0" when the respective transistor is conductive and a binary "1" when the respective transistor is blocked, and means connecting said transistors to said key switches in a manner such that actuation of a switch in a first one of said columns renders only a first one of said transistors conductive, actuation of a switch in a second one of said columns renders only a second one of said transistors conductive, and actuation of a switch in a third one of said columns renders both of said transistors conductive, while both of said transistors remain blocked when a switch in only the fourth one of said columns is actuated.

14. A system as defined in claim 12 further comprising two flip-flops each connected to supply a respective one of said binary signals to said comparator.

15. A system as defined in claim 11 wherein said memory is constituted by a shift register having a plurality of stages equal in number to the number of time channels in each time region, the key switches in each matrix row being connected to a respective stage of said register in a manner such that actuation of a key switch places a binary "0" in its respective stage of said shift register, while a binary "1" is placed in the other stages of said shift register.

16. A system as defined in claim 11 wherein said counter comprises four counter stages connected in series to form a counting chain, with the first counter in said chain being arranged to emit a shift pulse to be counted by the next-succeeding counter stage after every sixteen oscillations from said oscillator, the second and third counter stages in said chain each being arranged to emit a shift pulse to be counted by the next-succeeding counter stage after every ten pulses which it counts, and the last counter stage in said chain being a three-stage binary counter having the outputs of at least two of its stages connected to said comparator to supply the counting state output thereto.

17. A system as defined in claim 15 wherein said counter comprises four counter stages connected in series to form a counting chain, with the first counter in said chain being arranged to emit a shift pulse to be counted by the next-succeeding counter stage after every sixteen oscillations from said oscillator, the second and third counter stages in said chain each being arranged to emit a shift pulse to be counted by the next-succeeding counter stage after every ten pulses which it counts, and the last counter stage in said chain being a three-stage binary counter having the outputs of at least two of its stages connected to said comparator to supply the counting state output thereto, said memory is provided with a shift input for receiving pulses to effect shifting from stage to stage within said memory, and further comprising gate means connected for conveying the shift pulses from one of said counter stages ahead of said last stage to said shift input of said memory, and means enabling said gate means at the beginning of the time region associated with an actuated key switch.

18. A system as defined in claim 17 further comprising a flip-flop having its input connected to the output of said memory to place the output of said flip-flop in the logic "1" state when a logic "1" appears at the output of said memory, and said oscillator is arranged to oscillate at the second frequency and is connected to said flip-flop to oscillate at the second frequency when the output of said flip-flop is in the logic "1" state.

19. A system as defined in claim 18 further comprising a delaying circuit connected for causing said oscillator to oscillate for at least a minimum length of time at the frequency at which it has started to oscillate.

20. A system as defined in claim 19 wherein said delaying circuit comprises a counter unit connected to receive and count shift pulses from said one of said counter stages ahead of said last stage and to have a selected counter output state which represents such minimum length of time.

21. A system as defined in claim 11 further comprising a starting pulse generator connected to generate a pulse upon actuation of a key switch and to supply such pulse for resetting said counter and setting said memory, to supply a signal to said comparator identifying the time region associated with such actuated switch, and to start said oscillator.

22. A system as defined in claim 21 further comprising a flip-flop connected between said key switches and said starting pulse generator and further connected to said oscillator for allowing said generator to produce such a pulse only if the oscillator has ceased a previous oscillation in order to provide a minimum interval between successive remote control signals and prevent the adverse effects of echoes and reverberations.

23. A system as defined in claim 11 wherein said transmitter further comprises: a source of operating voltage having one side connected to the transmitter circuits and to one side of each said key switch, the other side of each said key switch being connected to the other side of said source of operating voltage; a NAND-gate having inputs connected to the one side of each said key switch to be connected to said other side of said source of operating voltage by the closing of one of said switches; a transistor having its collector-emitter path connected between the transmitter circuits and said other side of said source of operating voltage and having its base connected to the output of said NAND-gate to receive a voltage which renders said transistor conductive when any input of said NAND gate is connected to said other side of said source of operating voltage, whereby the connection of the operating voltage to the transmitter circuits is completed upon actuation of a key switch.

24. A system as defined in claim 23 further comprising a monostable circuit having an output connected to an input of said NAND-gate and an input connected to said oscillator for providing a signal at its output which causes the output of said NAND-gate to render said transistor conductive when said oscillator is producing oscillations.

25. A system as defined in claim 11 further comprising an exclusive-OR circuit to which key switches in adjacent rows of said matrix are connected in pairs, said circuit providing an output when only a key switch in one row of said matrix is actuated at a given time for preventing generation of an incorrect remote control instruction.

* * * * *